(12) United States Patent
Kanamitsu

(10) Patent No.: US 7,927,770 B2
(45) Date of Patent: Apr. 19, 2011

(54) DEFECT CORRECTION METHOD FOR EUV MASK

(75) Inventor: Shingo Kanamitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/556,779

(22) Filed: Sep. 10, 2009

(65) Prior Publication Data
US 2010/0112464 A1 May 6, 2010

(30) Foreign Application Priority Data

Oct. 30, 2008 (JP) ................. P2008-279909

(51) Int. Cl.
*G03F 1/00* (2006.01)
(52) U.S. Cl. .......................................................... 430/5
(58) Field of Classification Search ............. 430/5, 394; 250/492.21, 492.22, 492.3
See application file for complete search history.

(56) References Cited

U.S. PATENT DOCUMENTS

| 6,753,538 B2 | 6/2004 | Musil et al. |
| 6,991,878 B2 * | 1/2006 | Kanamitsu et al. ............... 430/5 |

FOREIGN PATENT DOCUMENTS

JP 2004-537758 12/2004

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

According to an aspect of the present invention, there is provided a method for correcting a defect in an EUV mask, the method including: preparing an EUV mask including an absorption layer and an anti-reflection layer forming a pattern; recognizing a defect region in the pattern; defining a first region and a second region on the defect region, the second region extending from a desired pattern edge by a given distance, the first region being defined on the rest; removing the first region of the anti-reflection layer and the absorption layer by irradiating a beam in a first atmosphere; removing the second region of the anti-reflection layer and the absorption layer by irradiating the beam in a second atmosphere; and oxidizing an exposed side surface of the desired pattern edge of the absorption layer.

18 Claims, 15 Drawing Sheets

DEFECT CORRECTION METHOD FOR EUV MASK

CROSS-REFERENCE TO RELATED APPLICATIONS

This application claims priority from Japanese Patent Application No. 2008-279909 filed on Oct. 30, 2008, the entire contents of which are incorporated herein by reference.

BACKGROUND OF THE INVENTION

1. Field of the Invention

An aspect of the present invention relates to a defect correction method for an EUV mask.

2. Description of the Related Art

At present, transmission-type photomasks are used as exposure masks in manufacture of semiconductor integrated circuits. With those photomasks, reduction exposure is performed using mainly ultraviolet light of 248 nm or 193 nm in wavelength. In many cases, the optical magnification of the reduction exposure is set at ¼. Such transmission-type photomask will continue to be used for manufacturing memory devices whose half pitch is longer than about 30 to 40 nm, in view of their physical properties and manufacturing costs.

On the other hand, to manufacture further-miniaturized devices, other methods are being studied. One method is an extreme ultraviolet (EUV) photo-exposure technology. Photomasks (hereinafter referred to as EUV masks) in the EUV photo-exposure technology are used in reflection-type projection optical systems and thus different in structure from the transmission-type photomasks. The optical magnification in the EUV photo-exposure technology will remain ¼, as with transmission-type photomasks. To manufacture EUV masks, a technique for manufacturing finer mask patterns than with transmission-type photomasks is required.

In a manufacturing process of the EUV masks, defects may be formed on a mask pattern. To correct the defects formed on the mask pattern, a correction apparatus using a focused ion beam (FIB) or an electron beam (EB) is used. The correction apparatus of focused ion beam (FIB) is insufficient in beam resolution. The correction apparatus of electron beam (EB) has a high resolution, but etching on individual correction portion takes long time. To increase the etching speed when using the correction apparatus of electron beam (EB), it is attempted to use a highly reactive gas. However, in this case, etching proceeds excessively to disable a highly accurate correction (refer to JP-2004-537758-T, for example).

SUMMARY OF THE INVENTION

According to an aspect of the present invention, there is provided a method for correcting a defect in an EUV mask, the method including: preparing an EUV mask including: a substrate; an absorption layer formed on the substrate; and an anti-reflection layer formed on the absorption layer, the absorption layer and the anti-reflection layer forming a pattern; recognizing a defect region in the pattern, the defect region being continuous from a desired pattern edge of the pattern; defining a first region and a second region on the defect region, the second region extending from the desired pattern edge by a given distance, the first region being defined on a rest of the defect region; removing the first region of the anti-reflection layer and the absorption layer by irradiating a beam thereonto in a first atmosphere; removing the second region of the anti-reflection layer and the absorption layer by irradiating the beam thereonto in a second atmosphere; and oxidizing an exposed side surface of the desired pattern edge of the absorption layer.

According to another aspect of the present invention, there is provided a method for manufacturing a semiconductor device, the method including: preparing an EUV mask in which a defect has been corrected by use of the above-described method; and manufacturing a semiconductor device by use of the EUV mask.

According to still another aspect of the present invention, there is provided a defect correction apparatus for an EUV mask, the defect correction apparatus including: a chamber; a stage on which an EUV mask is loaded, the EUV mask including: a substrate; an absorption layer formed on the substrate; and an anti-reflection layer formed on the absorption layer, the absorption layer and the anti-reflection layer forming a pattern; a gas supplying device configured to supply an etching gas and an oxidizing gas through a nozzle disposed inside the chamber; a beam irradiation device configured to irradiate a beam onto the EUV mask loaded on the stage; and a controller configured to: recognize a defect region that is continuous from a desired pattern edge of the pattern; define a first region and a second region on the defect region, the second region extending from the desired pattern edge by a given distance, the first region being defined on a rest of the defect region; control the gas supplying device to supply at least the etching gas inside the chamber; control the irradiation device to irradiate the beam onto the first region; control the gas supplying device to supply at least the etching gas inside the chamber; control the irradiation device to irradiate the beam onto the second region; and control the gas supplying device to supply the oxidizing gas inside the chamber so that an exposed side surface of the absorption layer is oxidized.

DETAILED DESCRIPTION OF THE INVENTION

Embodiments of the present invention will be hereinafter described with reference to the drawings.

First Embodiment

Figure 1A:
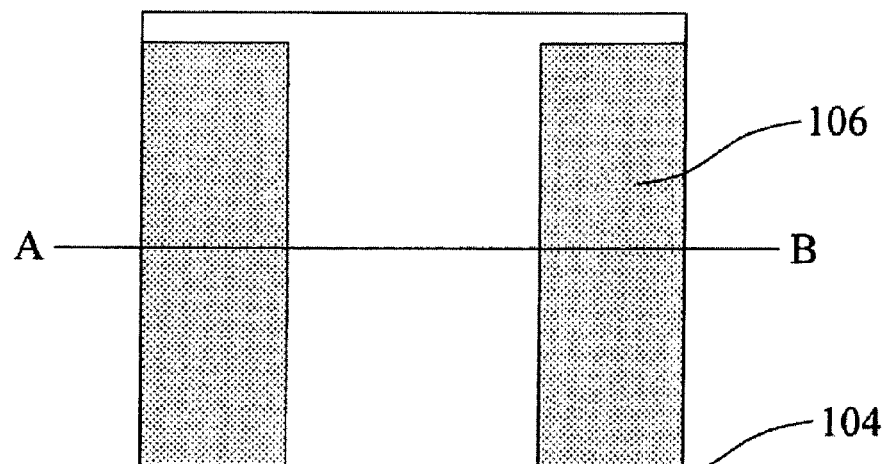
FIGS. 1A and 1B are a plan view and a sectional view, respectively, illustrating an EUV mask.
Figure 1B:
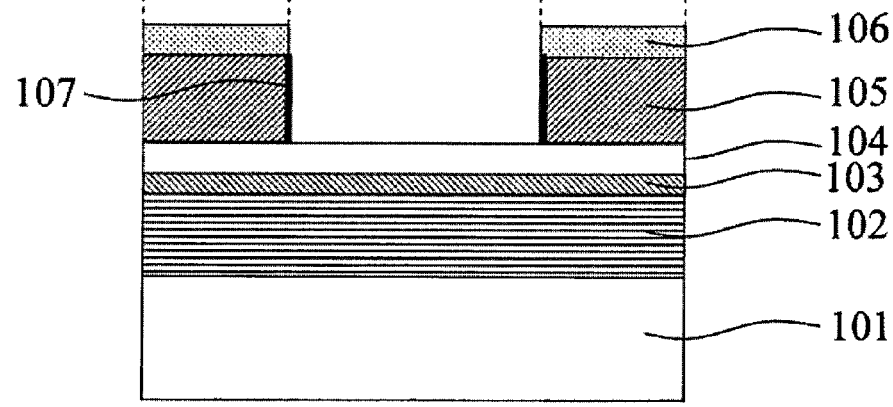

First, a defect correction method for an EUV mask according to a first embodiment will be described with reference to FIGS. 1A to 8. FIG. 1A is a plan view illustrating an EUV mask, and FIG. 1B is a sectional view taken along line A-B in FIG. 1A.

A mask pattern is formed by subjecting a mask blank for EUV exposure on steps of electron beam drawing, resist development, etching, cleaning, etc. FIGS. 1A and 1B illustrate the thus formed mask pattern. In the embodiment, the mask blank for EUV exposure has such a structure that a reflection layer 102, a capping layer 103, a buffer layer 104, an absorption layer 105 and an anti-reflection layer 106 are laminated in this order on a low-thermal-expansion mask substrate 101.

For example, the reflection layer 102 is a multilayer in which molybdenum and silicon thin films are alternately laminated, the capping layer 103 is a silicon film, and the buffer layer 104 is a chromium-based material film. When a mask blank is formed to not have a buffer layer 104, the capping layer 103 may be a ruthenium film. For example, the absorption layer 105 is made of tantalum boron nitride or tantalum nitride and the anti-reflection layer 106 is made of tantalum boron oxide or tantalum oxide.

Tantalum, which is used in the absorption layer 105 and the anti-reflection layer 106, is prone to oxidation. In a state where the pattern has been formed, an oxide coating 107 is formed on the side surface of the absorption layer 105 through a reaction with oxygen in the air. On the other hand, the anti-reflection layer 106 is not affected by the air since the anti-reflection layer 106 itself is an oxide film.

Figure 2A:
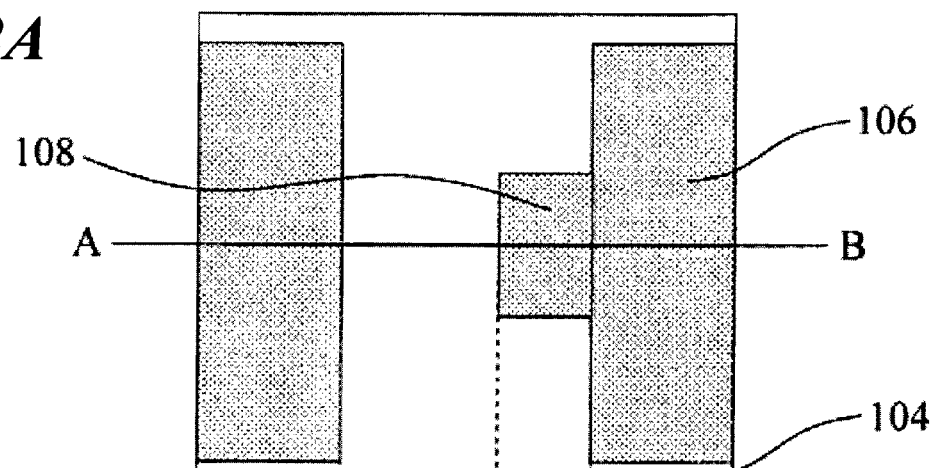
FIGS. 2A and 2B are a plan view and a sectional view, respectively, illustrating a defect region.
Figure 2B:
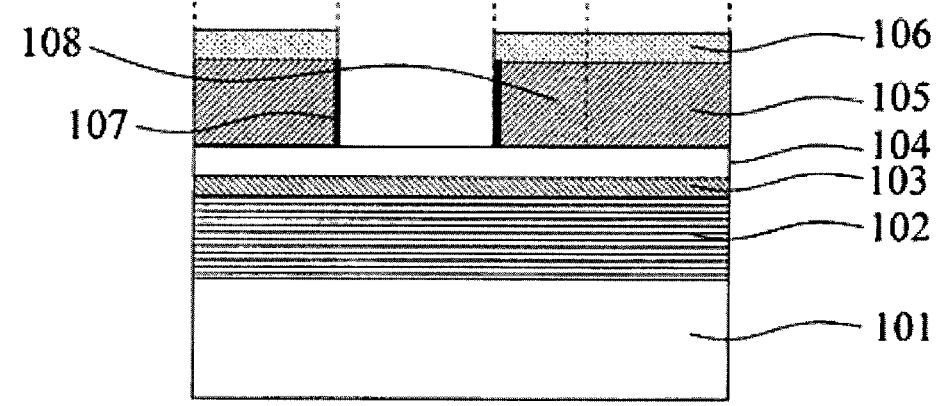
Figure 3A:
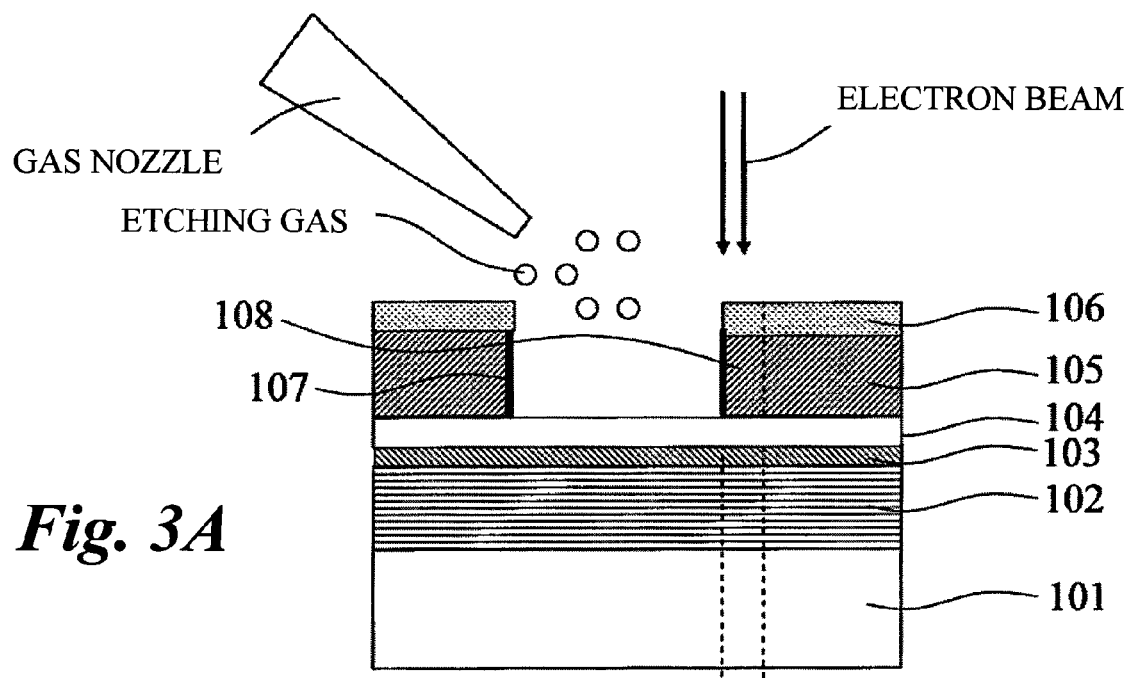
FIGS. 3A and 3B are plan views illustrating an etching-correction of a defect region by an EB correction apparatus using a $XeF_2$ gas.
Figure 3B:
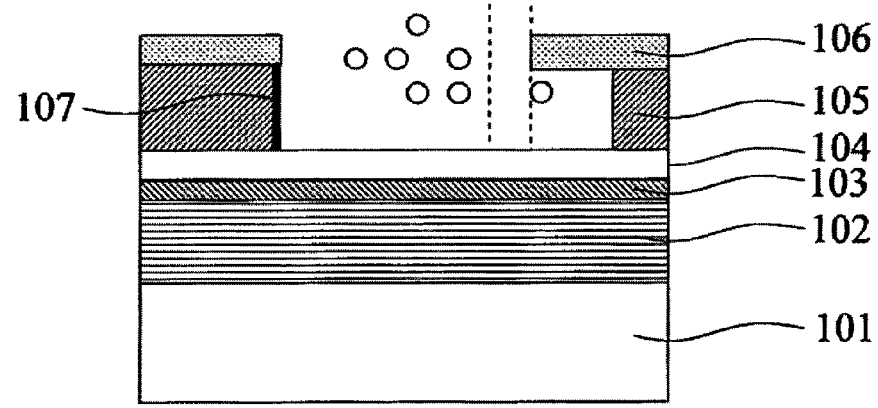

The patterned mask is subjected to a defect inspection, such as a data comparison inspection and a pattern comparison inspection using a shape inspection instrument. A description will be made of a case that a defect region 108 as shown in FIGS. 2A and 2B has been detected by the defect inspection. For example, such a defect region 108 is generated because of dust sticks to the mask during procedure for forming a pattern. Masks from which no defect is detected are brought to the next step skipping a correction step.

As a photomask defect correction apparatus, for example, a correction apparatus using a focused ion beam (FIB) (hereinafter referred to as an FIB correction apparatus) or a correction apparatus using an electron beam (EB) (hereinafter referred to as an EB correction apparatus) is used. Generally, an FIB correction apparatus of a gallium ion beam that has been practically used is not sufficient in a resolution to correct fine patterns formed in EUV masks. In view of the resolution, at present, EB correction apparatus is suitable for EUV masks. EB correction apparatus has a sufficient resolution even for a line-and-space pattern of about 100 nm in pitch.

Irrespective of whether FIB correction apparatus or EB correction apparatus is used, correction is performed by applying a beam to the defect region 108 in a vacuum chamber while supplying an etching gas that is highly reactive to the subject film. Where the defect region 108 is etching-corrected by an FIB correction apparatus, the sputtering action of an ion beam itself contributes greatly, and the etching gas merely assists the beam sputtering. Therefore, a low-reactivity gas such as a chlorine gas or an iodine gas can be used as the etching gas.

On the other hand, where the defect region 108 is etching-corrected by an EB correction apparatus, the sputtering action of an electron beam itself is very weak, and the etching gas exited as a reaction species by the electron beam reacts to the subject film in the defect region 108. Therefore, when a low-reactivity gas is used, etching takes a long time, and throughput is reduced. In view of this, in many cases, EB correction apparatus employ a fluorine-based gas which exhibits relatively high reactivity. In the embodiment, a xenon difluoride ($XeF_2$) gas is used as the fluorine-based gas in the correction apparatus.

As described above, in the EUV mask, the absorption layer 105 is made of tantalum boron nitride or tantalum nitride (TaN). These materials have a property that they react directly to an etching gas $XeF_2$ and dissolve. Therefore, if these materials are etched using $XeF_2$, etching proceeds excessively and hence the defect region 108 cannot be corrected appropriately (see FIGS. 3A and 3B). Further, an undercut occurs may be caused in a mask pattern edge because only the absorption layer 105 is etched isotropically while the anti-reflection layer 106 of tantalum oxide is not etched.

In the defect correction method for an EUV mask according to the first embodiment, the correction by irradiation with an electron beam is performed in two steps so that the above problems are solved. In the embodiment, a step of loading an EUV mask into the EB correction apparatus, a step of moving the position of attention to defect-detected coordinates, a step of capturing an image in an area of several micrometers including the defect, a step of determining a correction region on the basis of the image information, and other steps are executed. The EB correction apparatus is capable of obtaining a SEM (scanning electron microscope) image consists of pixels having a dot pitch of 1 nm, and the correction can be performed on a dot-by-dot basis.

Figure 4A:
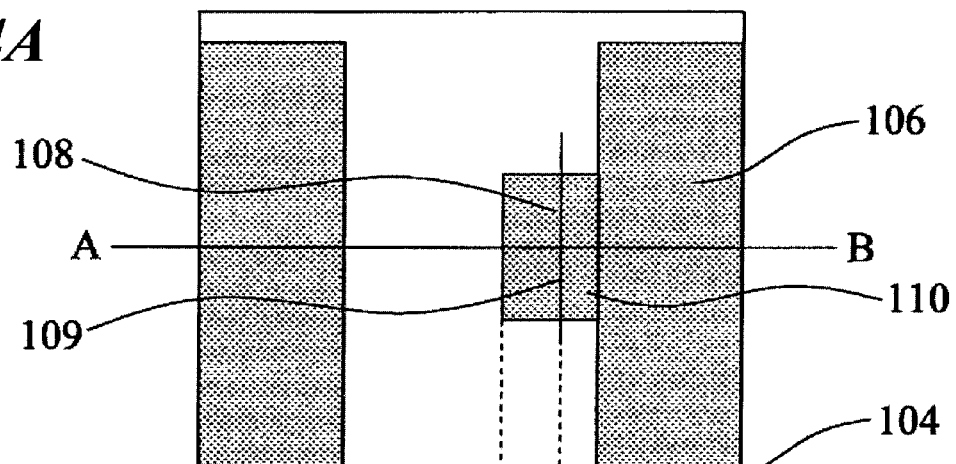
FIGS. 4A and 4B are a plan view and a sectional view, respectively, illustrating a determination of a primary irradiation region and a secondary irradiation region.
Figure 4B:
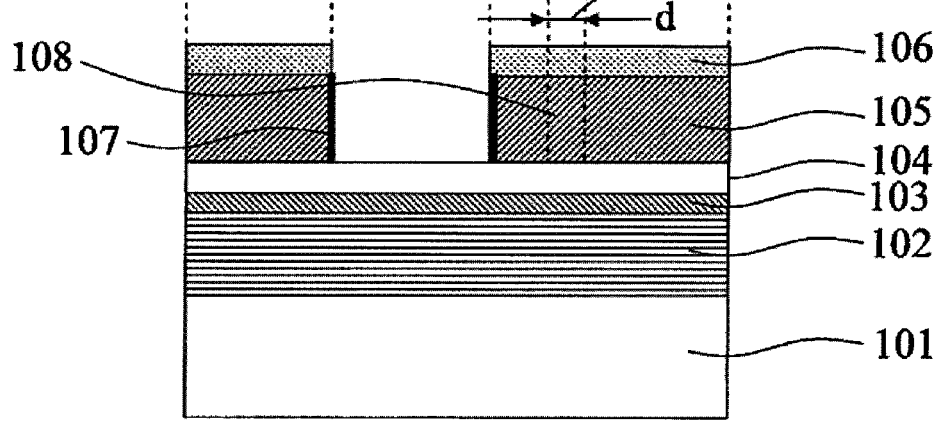

First, in a defect region 108, a region (hereinafter referred to as a primary irradiation region) 109 to be corrected by first electron beam irradiation and a region (hereinafter referred to as a secondary irradiation region) 110 to be corrected by second electron beam irradiation are determined (see FIGS. 4A and 4B). A region that is within a distance d from the edge of a target pattern is employed as the secondary irradiation region 110, and a region that is distant from the edge of the target pattern by more than the distance d is employed as the primary irradiation region 109. For example, a side etching amount that is a retreat amount of the absorption layer 105 from the edge of the anti-reflection layer 106 when the isotropic etching is performed is previously measured by an experiment, a simulation, or the like, and the distance d is set based on the side etching amount.

Figure 5A:
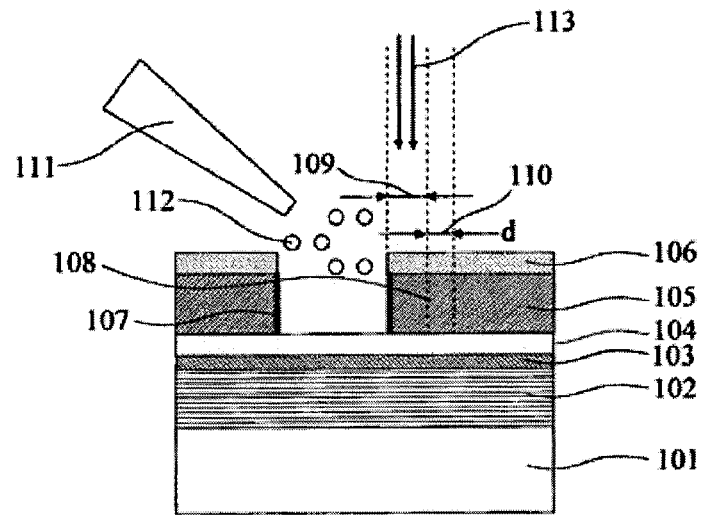
FIGS. 5A-5C illustrate a defect correction process for EUV mask according to a first embodiment.

After the primary irradiation region 109 and the secondary irradiation region 110 have been set, as shown in FIG. 5A, only the primary irradiation region 109 is irradiated with an electron beam 113 while a $XeF_2$ gas 112 is supplied from a gas nozzle 111 inside a vacuum chamber. Since the anti-reflection layer 106 is made of tantalum oxide, it reacts to only the XeF$_2$ gas 112 which is irradiated with the electron beam 113 to form a reaction species. As a result, that portion of the anti-reflection layer 106 which is located in the primary irradiation region 109 is etched away as shown in FIG. 5B.

Figure 5B:
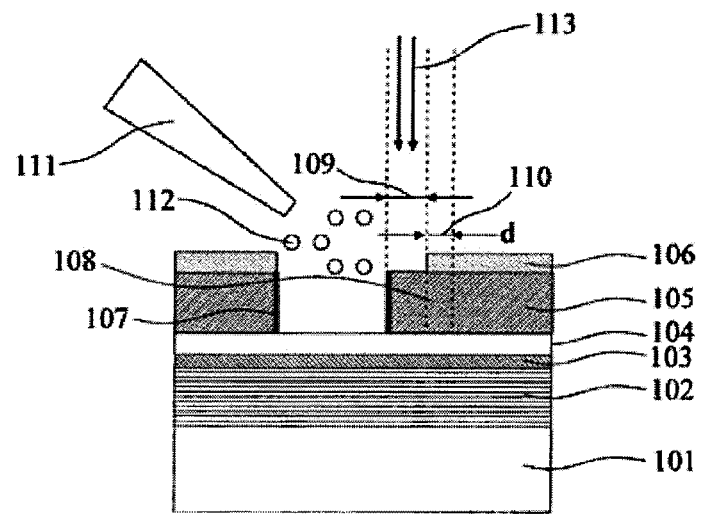
Figure 5C:
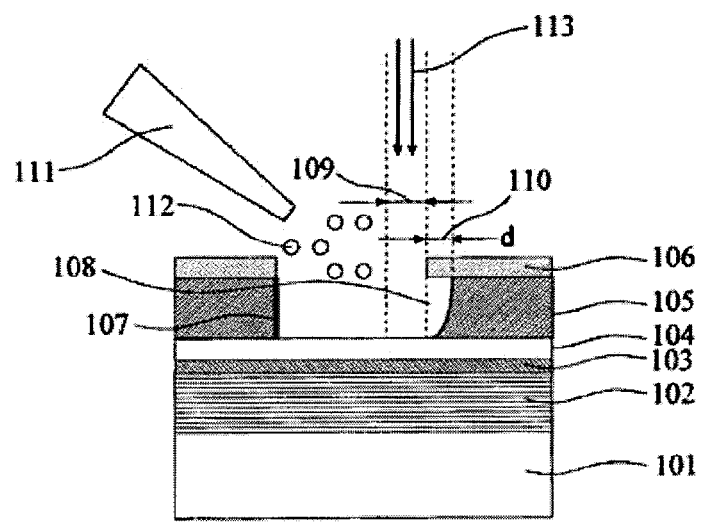

The etching is continued from the state of FIG. 5B, whereby the absorption layer 105 is etched isotropically as shown in FIG. 5C. Whether the etching has reached the end point (the buffer layer 104 located under the absorption layer 105) may be judged based on whether a preset time has elapsed. Alternatively, whether the etching has reached the end point may be judged by detecting back-scattered electrons. The preset etching time may be set by calculating an etching rate from a gas pressure and beam conditions.

Since the etching rate of the absorption layer 105 is high, the gas pressure for etching the absorption layer 105 may be set lower than the gas pressure for etching the anti-reflection layer 106. In either case, as soon as the downward etching has reached the buffer layer 104, the supplying of the XeF$_2$ gas is stopped to prevent further downward progress of the etching. Since the side etching amount of the absorption layer 105 is substantially equal to the distance d that is previously set when determining the primary irradiation region 109 and the secondary irradiation region 110, the shape of the defect region 108 can be made close to the shape of the target pattern.

Figure 6A:
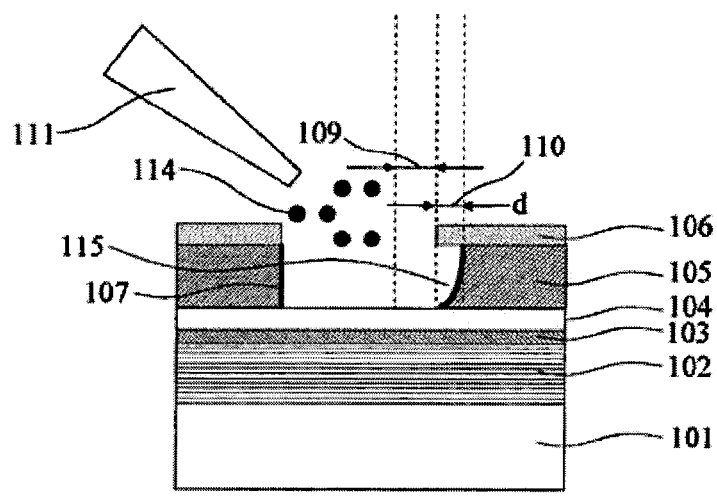
FIGS. 6A-6C illustrate the defect correction process for EUV mask according to the first embodiment.

After the isotropic etching of the absorption layer 105, to prevent further side etching of the absorption layer 105, an oxide coating 115 is formed on a side surface thereof by introducing an oxidizing gas 114 into the chamber (see FIG. 6A). For example, an O$_2$ gas is used as the oxidizing gas 114 in the embodiment.

Figure 6B:
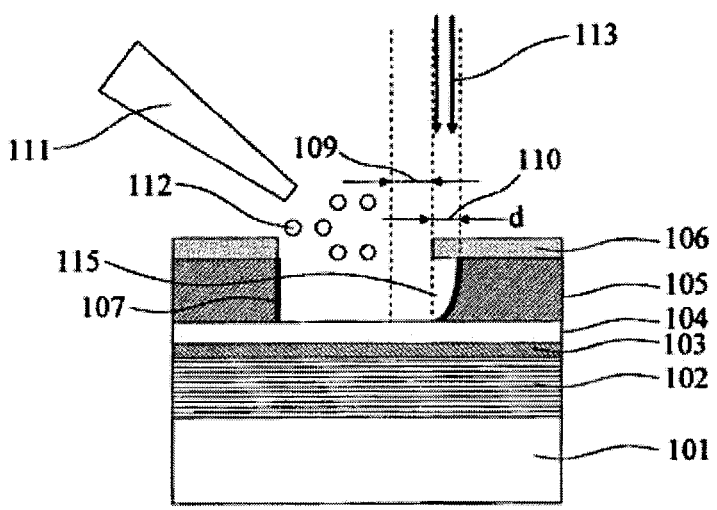

Then, the anti-reflection layer 106 in the secondary irradiation region 110 is etched (see FIG. 6B). In this step, as in the step of FIG. 5A, the etching can be performed accurately because the anti-reflection layer 106 reacts to only a XeF$_2$ gas 112 which is irradiation with an electron beam 113 to form a reaction species, and the absorption layer 105 is not etched because it is covered with the oxide coating 115.

Figure 6C:
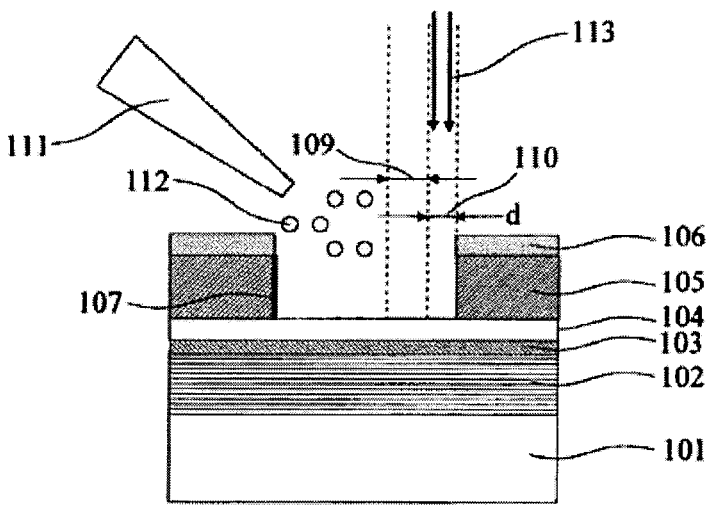
Figure 7:
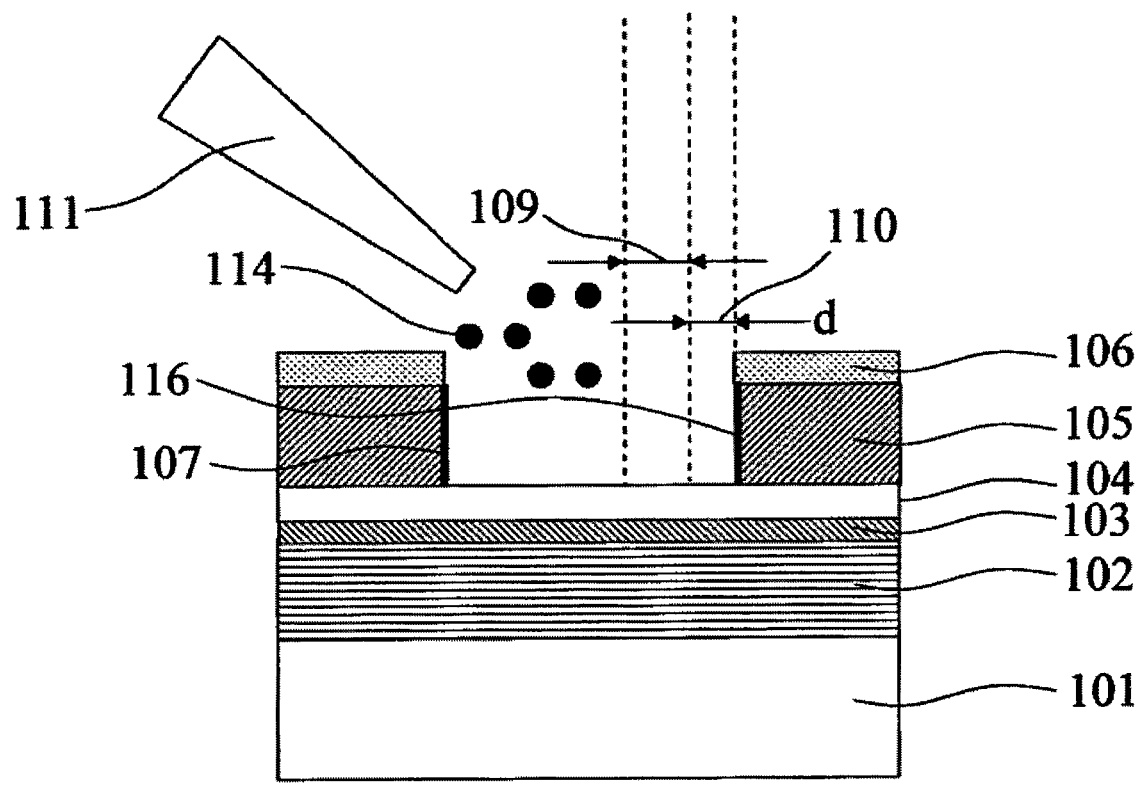
FIG. 7 illustrates the defect correction process for EUV mask according to the first embodiment.

Then, the absorption layer 105 in the secondary irradiation region 110 is irradiated with the electron beam 113, whereby a shape shown in FIG. 6C is obtained. In this step, for example, an etching end point is recognized by capturing back-scattered electrons. Since the absorption layer 105 to be etched away is very small, by irradiating a beam dose only for the anti-reflection layer 106 and then irradiating a light beam dose for the absorption layer 105, the vertical shape as shown in FIG. 6C can be obtained finally. While adjusting the beam dose, the flow rate of the etching gas may be reduced.

In this step, an undercut would be formed again if the etching were performed excessively. Therefore, for example, the gas pressure may be lowered after the portion of the anti-reflection layer 106 has been etched away. For example, as the end point control, increasing of the etching gas flow rate in the step of etching the anti-reflection layer 106 and decreasing of the etching gas flow rate in the step of etching the absorption layer 105 are also effective. These measures may be combined as appropriate.

When the etching has reached an end point, the process gas is switched from the XeF$_2$ gas 112 to an oxidizing gas 114. As a result, an oxide coating 116 is formed on a side surface that has exposed through the etching (see FIG. 7). The oxide coating 116 serves as a side surface protective member and prevents influence of an etching gas when another defect region that is located within several millimeters from the corrected defect region is corrected likewise.

Figure 8:
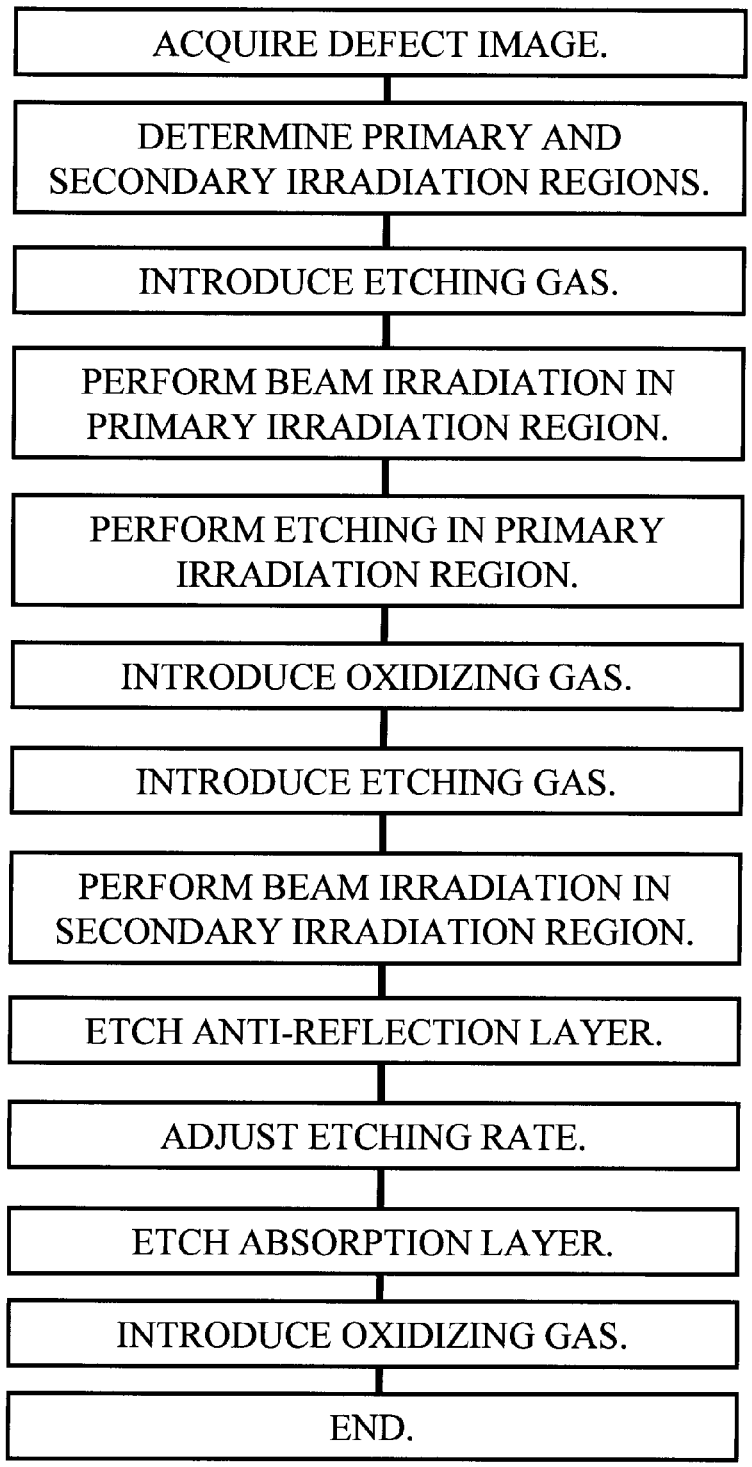
FIG. 8 is a flowchart of the defect correction process for EUV mask according to the first embodiment.

FIG. 8 is a flowchart of the above-described defect correction process for EUV mask according to the embodiment. In the embodiment, an electron beam is used to excite an etching gas, a XeF$_2$ gas is used as the etching gas, and an O$_2$ gas is used as the oxidizing gas. Alternatively, an ion beam may be used. An etching process using a chlorine gas or an iodine gas may be employed. Water (H$_2$O) may be used as the oxidizing agent. An oxidizing gas other than the O$_2$ gas and the H$_2$O gas may be used as long as it provides the same effect.

In the method according to the embodiment, a defect is sequentially collected by determining a primary irradiation region 109 and a secondary irradiation region 110 at the same time. In that exemplary procedure, the defect correction process is executed fast. As another exemplary procedure, after completion of processing in the primary irradiation region 109, a secondary irradiation region 110 may be re-set by taking a SEM image again. In this case, since correction errors in the primary irradiation region 109 can be recognized and a secondary irradiation region 110 can be re-set accordingly, the final correction accuracy can thus be increased.

As described above, the defect correction method according to the first embodiment enables accurate defect correction on an EUV mask.

Second Embodiment

Next, a defect correction method according to a second embodiment will be described with reference to FIGS. 9A to 11. Although a primary irradiation region and a secondary irradiation region are set in the same manner as in the above-described first embodiment, they are set at a different ratio than in the first embodiment because of differences in the etching process. The second embodiment will be described by giving the same reference symbols to the same layers etc. as in the first embodiment.

Figure 9A:
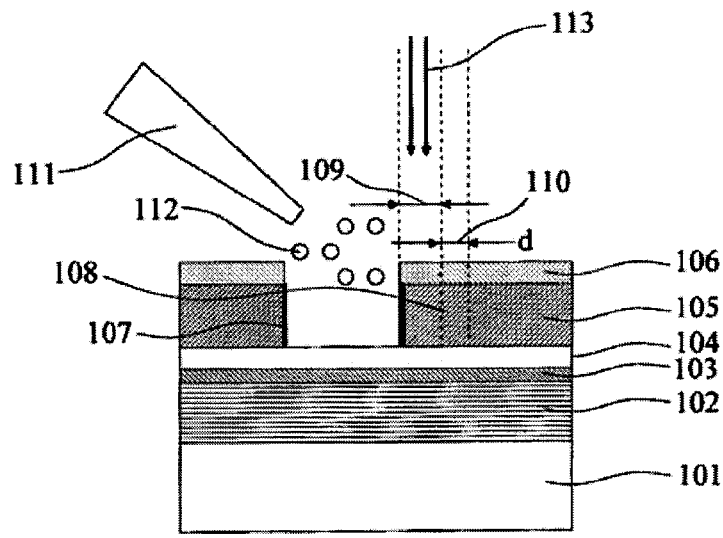
FIGS. 9A-9C illustrate a defect correction process for EUV mask according to a second embodiment.

After the primary irradiation region 109 and the secondary irradiation region 110 have been set, as shown in FIG. 9A, only the primary irradiation region 109 is irradiated with an electron beam 113 while a XeF$_2$ gas 112 is supplied from a gas nozzle 111 inside a vacuum chamber. Since the anti-reflection layer 106 is made of tantalum oxide, it reacts to only the XeF$_2$ gas 112 which is irradiated with the electron beam 113 to form a reaction species. As a result, the anti-reflection layer 106 in the primary irradiation region 109 is etched away as shown in FIG. 9B.

Figure 9B:
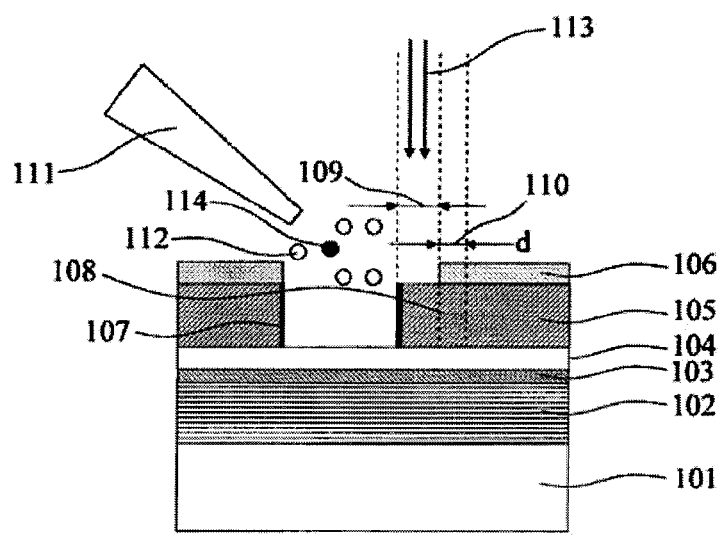
Figure 9C:
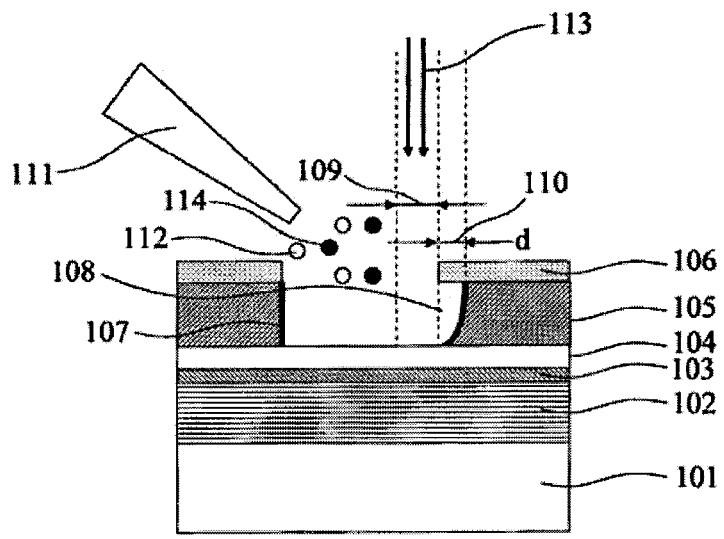

The etching is continued from the state of FIG. 9B. In the embodiment, as shown in FIG. 9C, a mixed gas of an O$_2$ gas and a XeF$_2$ gas is used as a process gas. O$_2$ has is used as an oxidizing gas. As a result, a proper etching rate is attained because the process proceeds in such a manner that the absorption layer 105 is oxidized and etched repeatedly. For example, the ratio of the oxidizing gas 114 is increased as the etching proceeds so that only the oxidizing gas 114 is supplied after the etching has reached an end point. Whether the etching has reached the end point may be judged based on a preset time or judged by detecting back-scattered electrons. The preset etching time may be set by calculating an etching rate from a gas pressure and beam conditions.

When etching the absorption layer 105, a side etching occurs to a certain extent, and a side etching amount depends on the ratio of the oxidizing gas 114. Therefore, for example, the side etching amount is previously obtained through an experiment. As in the first embodiment, a primary irradiation region 109 and a secondary irradiation region 110 are set according to the predicted side etching amount. The side etching amount in the second embodiment would be different than in the first embodiment.

Figure 10A:
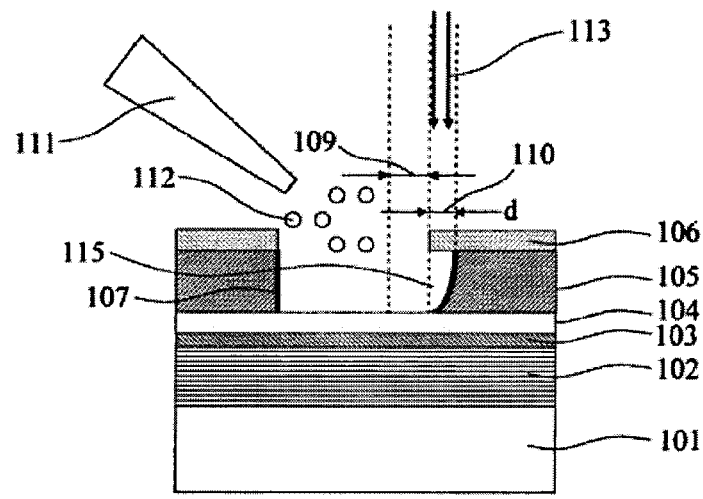
FIGS. 10A-10C illustrate the defect correction process for EUV mask according to the second embodiment.
Figure 10B:
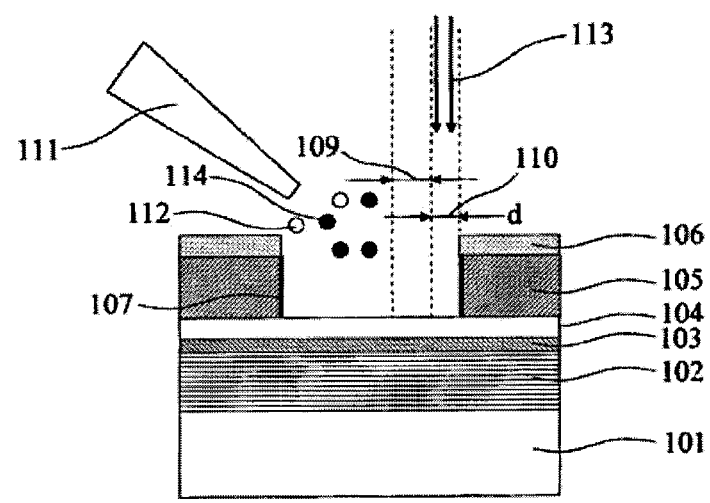
Figure 10C:
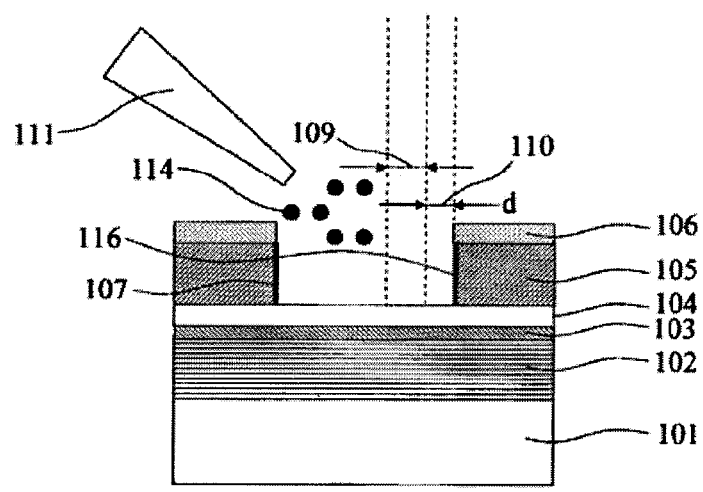

Then, the anti-reflection layer 106 in the secondary irradiation region 110 is etched (see FIG. 10A). At a start, for example, a process gas is formed only by the $XeF_2$ gas (100%). The oxidizing gas 114 starts to be added immediately before the anti-reflection film 106 in the secondary irradiation region 110 is removed, and its ratio is thereafter increased gradually (see FIG. 10B). After the anti-reflection film 106 in the secondary irradiation region 110 has been removed, the only remaining step is to cut away the trailing portion of the absorption layer 105. A vertical edge can be formed stably by increasing the ratio of the oxidizing gas 114 and thereby lowering the etching rate gradually. According to this procedure, for example, the probability that the etching proceeds laterally breaking an oxide coating 115 that is already formed on the side surface. At the start, the process gas may be formed not only by the $XeF_2$ gas (100%), and for example, the process gas may include several to several tens percent of the oxidizing gas.

When the etching has reached an end point so that a vertical shape of the absorption layer 105 has been obtained, the process gas is switched from the $XeF_2$ gas 112 to a 100% oxidizing gas 114 (see FIG. 10C) to form an oxide coating 116 on the side surface in order to maintain the vertical shape. The oxide coating 116 serves as a side surface protective member and prevents influence of an etching gas when another defect region that is located within several millimeters from the corrected defect region is corrected likewise.

Figure 11:
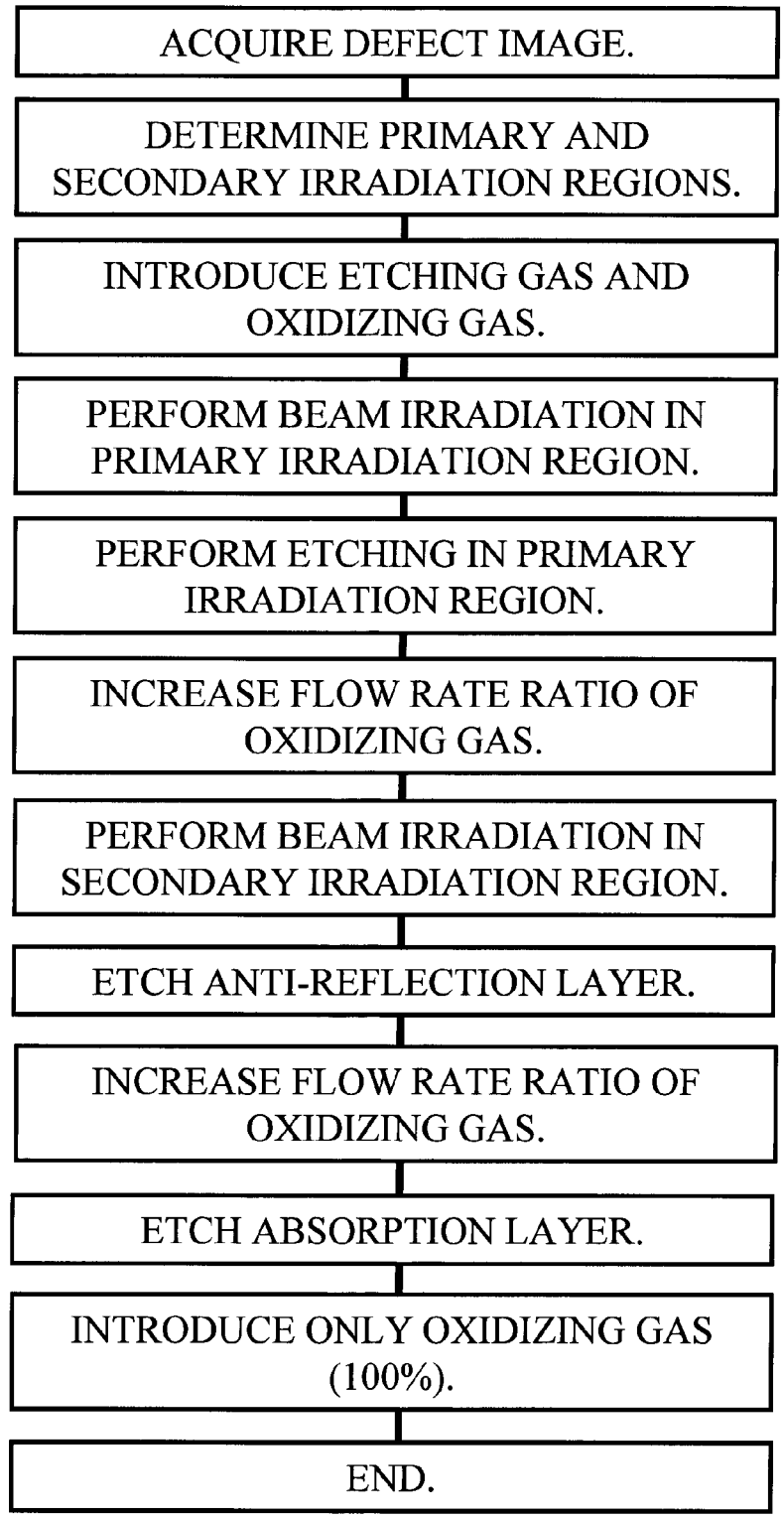
FIG. 11 is a flowchart of the defect correction process for EUV mask according to the second embodiment.

FIG. 11 is a flowchart of the above-described defect correction process for EUV mask according to the embodiment. In the embodiment, an electron beam is used to excite an etching gas, a $XeF_2$ gas is used as the etching gas, and an $O_2$ gas is used as the oxidizing gas. Alternatively, an ion beam may be used. An etching process using a chlorine gas or an iodine gas may be employed. Water ($H_2O$) may be used as the oxidizing agent. An oxidizing gas other than the $O_2$ gas and the $H_2O$ gas may be used as long as it provides the same effect.

In the method according to the embodiment, a defect is sequentially collected by determining a primary irradiation region 109 and a secondary irradiation region 110 at the same time. In that exemplary procedure, the defect correction process is executed fast. As another exemplary procedure, after completion of processing in the primary irradiation region 109, a secondary irradiation region 110 may be re-set by taking a SEM image again. In this case, since correction errors in the primary irradiation region 109 can be recognized and a secondary irradiation region 110 can be re-set accordingly, the final correction accuracy can thus be increased.

As described above, the defect correction method according to the second embodiment enables accurate defect correction on an EUV mask.

The invention is not limited to the above embodiments and various modifications are possible without departing from the spirit and scope of the invention.

Figure 12:
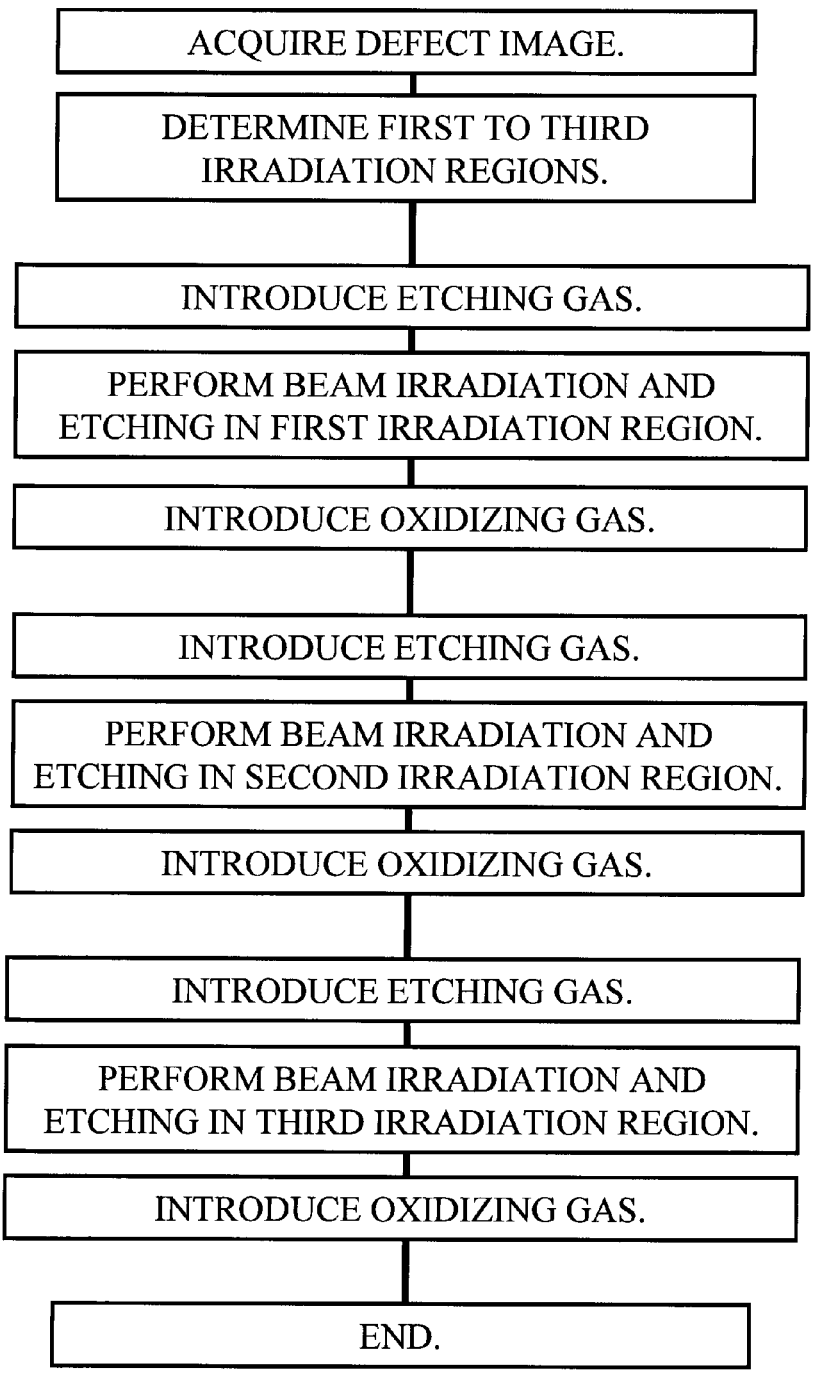
FIG. 12 is a flowchart of a modification example of the defect correction process for EUV mask.

Although two of beam irradiation regions are set on a defect region in the first and second embodiments, three or more of beam irradiation regions may be set. For example, from a distal side to a proximal side of a defect region that protrudes from a desired pattern edge, first to third irradiation regions may be defined in this order. In this case, as shown in FIG. 12, the beam irradiation is performed for each region in the etching gas atmosphere.

Figure 13A:
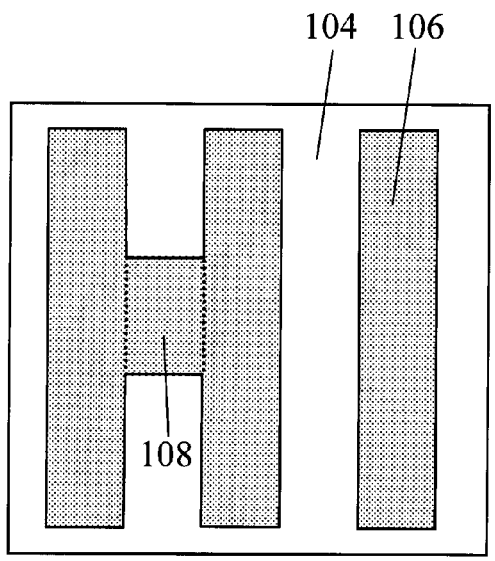
FIGS. 13A and 13B illustrate an exemplary procedure of determining a primary irradiation region and a secondary irradiation region.
Figure 13B:
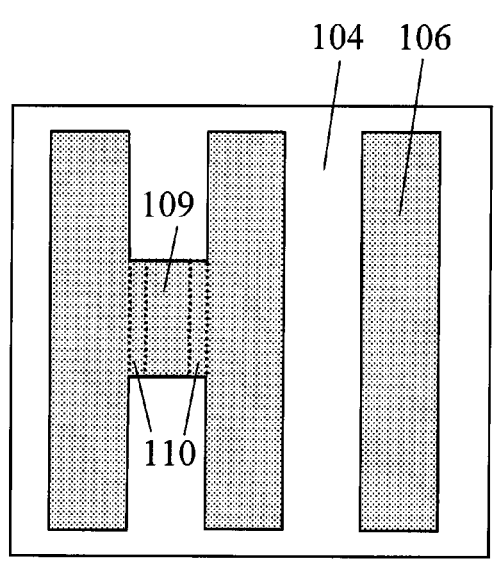
Figure 14A:
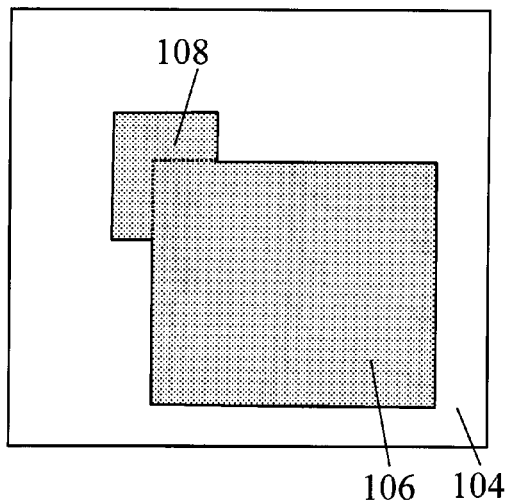
FIGS. 14A and 14B illustrate another exemplary procedure of determining a primary irradiation region and a secondary irradiation region.
Figure 14B:
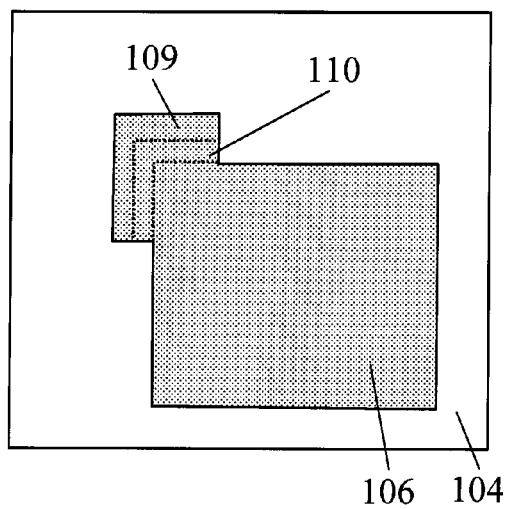
Figure 15A:
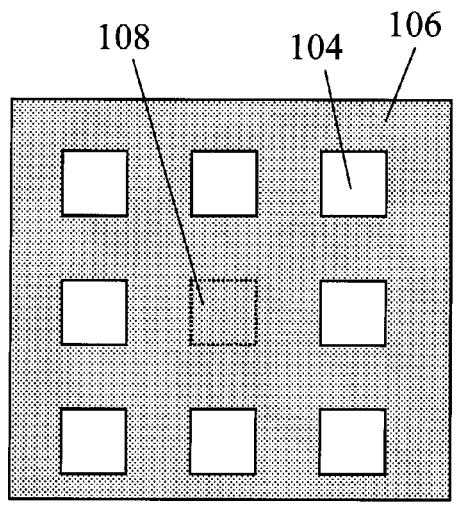
FIGS. 15A and 15B illustrate still another exemplary procedure of determining a primary irradiation region and a secondary irradiation region.
Figure 15B:
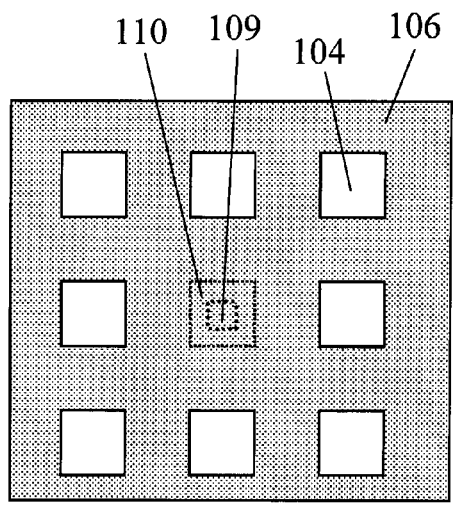
Figure 16A:
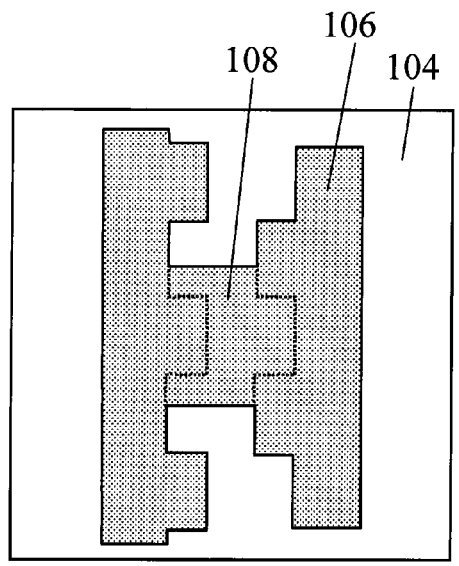
FIGS. 16A and 16B illustrate still another exemplary procedure of determining a primary irradiation region and a secondary irradiation region.
Figure 16B:
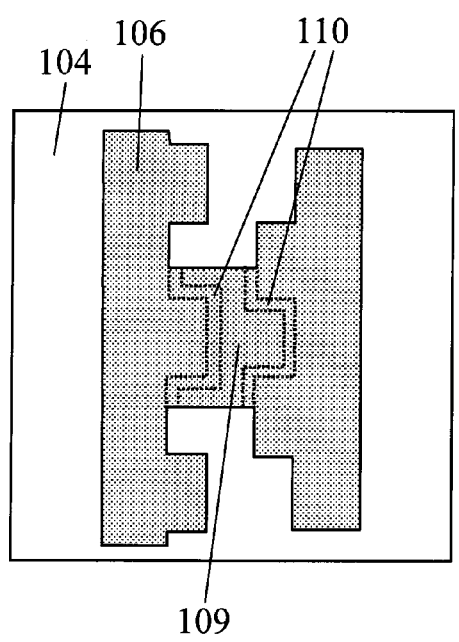

Although the defect that protrudes from an edge of the desired pattern is corrected as a correction object in the first and second embodiments, other shape of defect also can be corrected. For example, a defect may be formed in the line and space pattern as shown in FIG. 13A, a defect may be formed on a corner of the pattern as shown in FIG. 14A, a defect may be formed in the hole pattern as shown in FIG. 15A, and a defect may be formed in the DRAM (Dynamic Random Access Memory) pattern as shown in FIG. 16A.

On the defect 108, a boundary is defined so as to be far from any edge of the desired pattern by at least the distance d. And, the secondary irradiation region 110 is defined on a portion in the defect 108 between the boundary and the edges, and the primary irradiation region 109 is defined on the rest portion.

After the primary irradiation region 109 and the secondary irradiation region 110 are defined as shown in FIGS. 13B, 14B, 15B and 16B, the method according to the first and second embodiments is applied to correct the defect 108.

According to the first and second embodiments, a defect in an EUV mask can be corrected. By using such defect-corrected EUV mask, a semiconductor device can be accurately manufactured.

Figure 17:
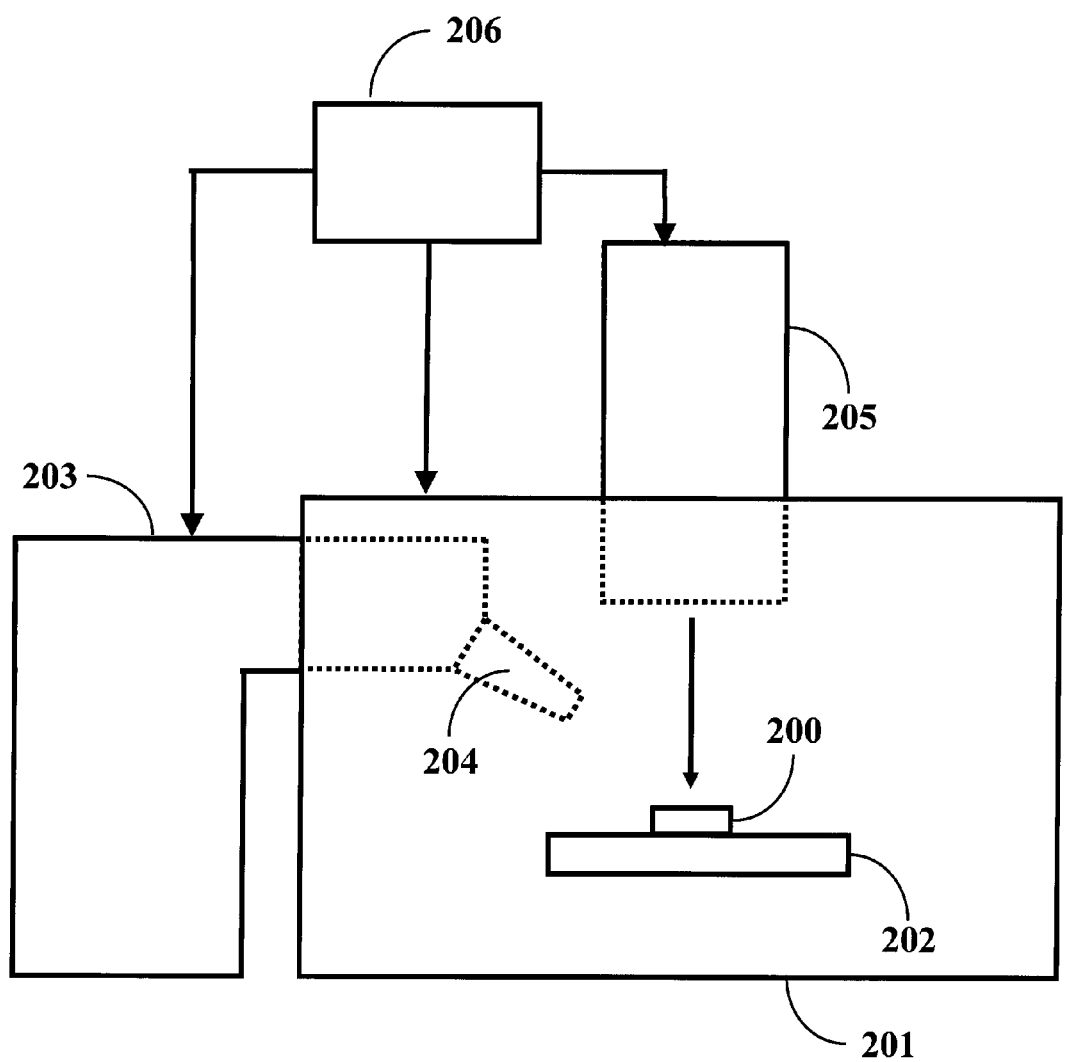
FIG. 17 illustrates an example of a defect correction apparatus.

An example of a defect correction apparatus that is used to perform the defect correction method according to the first and second embodiments is shown in FIG. 17. The defect correction apparatus shown in FIG. 17 includes a chamber 201, a gas supplying device 203, a beam irradiation device 205 and a controller 206.

In the chamber 201, a stage 202 on which an EUV mask 200 as a defect correction object is loaded. The gas supplying device 203 includes a nozzle 204 that is disposed inside the chamber 201 and supplies an etching gas and an oxidizing gas into the chamber 201. The beam irradiation device 205 is capable of irradiating an electron beam onto the EUV mask 200 loaded on the stage 202. The controller 206 controls the gas supplying device 203, the beam irradiation device 205, etc. to perform the defect correction method according to the first and second embodiments.

According to an aspect of the present invention, there is provided a defect correction method in which a defect in an EUV mask is accurately corrected.

What is claimed is:

1. A method for correcting a defect in an EUV mask, the method comprising:
    preparing an EUV mask including:
        a substrate;
        an absorption layer formed on the substrate; and
        an anti-reflection layer formed on the absorption layer, the absorption layer and the anti-reflection layer forming a pattern;
    recognizing a defect region in the pattern, the defect region being continuous from a desired pattern edge of the pattern;
    defining a first region and a second region on the defect region, the second region extending from the desired pattern edge by a given distance, the first region being defined on a rest of the defect region;
    removing the first region of the anti-reflection layer and the absorption layer by irradiating a beam thereonto in a first atmosphere;
    removing the second region of the anti-reflection layer and the absorption layer by irradiating the beam thereonto in a second atmosphere; and
    oxidizing an exposed side surface of the desired pattern edge of the absorption layer.

2. The method according to claim 1,
    wherein, in the step of removing the first region, the first atmosphere includes an etching gas.

3. The method according to claim 1, further comprising:
    oxidizing an exposed side surface of the second region of the absorption layer,
    wherein the step of oxidizing the second region is performed after the step of removing the first region.

4. The method according to claim 1,
wherein, in the step of removing the first region, the first atmosphere includes an etching gas and an oxidizing gas.

5. The method according to claim 4,
wherein, in the step of removing the first region, the first atmosphere is adjusted so that a ratio of the oxidizing gas to the etching gas is gradually increased.

6. The method according to claim 1,
wherein, in the step of removing the second region, the second atmosphere includes an etching gas, and
wherein, in the step of removing the second region, an etching condition is changed after the anti-reflection layer has been removed.

7. The method according to claim 6,
wherein, in the step of removing the second region, a flow late of the etching gas is lowered after the anti-reflection layer has been removed.

8. The method according to claim 6,
wherein, in the step of removing the second region, a gas pressure of the etching gas is lowered after the anti-reflection layer has been removed.

9. The method according to claim 1,
wherein, in the step of defining the first region and the second region, the given distance is determined based on a side etching amount to be occurred in the absorption layer.

10. The method according to claim 9,
wherein the side etching amount to be occurred is obtained through an experiment or a simulation.

11. The method according to claim 1,
wherein, in the step of defining the first region and the second region, the given distance is determined so that the first region is larger than the second region.

12. The method according to claim 1,
wherein the step of removing the first region and the step of removing the second region include irradiating an electron beam.

13. The method according to claim 1,
wherein the first atmosphere and the second atmosphere include an etching gas, and
wherein the etching gas includes at least $XeF_2$ gas.

14. The method according to claim 1,
wherein the step of oxidizing supplies at least one selected a group consisting of:
$H_2O$;
$O_2$ gas; and
$H_2O$ gas.

15. The method according to claim 1,
wherein the absorption layer includes at least one selected from a group consisting of:
tantalum boron nitride; and
tantalum nitride, and
wherein the anti-reflection layer includes at least one selected from a group consisting of:
tantalum boron oxide; and
tantalum oxide.

16. The method according to claim 1,
wherein, in the step of defining the first region and the second region, a third region is defined between the first region and the second region, and
wherein a step of removing the third region is performed between the step of removing the first region and the step of removing the second region.

17. A method for manufacturing a semiconductor device, the method comprising:
preparing an EUV mask in which a defect has been corrected by use of the method according to claim 1; and
manufacturing a semiconductor device by use of the EUV mask.

18. A defect correction apparatus for an EUV mask, the defect correction apparatus comprising:
a chamber;
a stage on which an EUV mask is loaded, the EUV mask including:
a substrate;
an absorption layer formed on the substrate; and
an anti-reflection layer formed on the absorption layer, the absorption layer and the anti-reflection layer forming a pattern;
a gas supplying device configured to supply an etching gas and an oxidizing gas through a nozzle disposed inside the chamber;
a beam irradiation device configured to irradiate a beam onto the EUV mask loaded on the stage; and
a controller configured to:
recognize a defect region that is continuous from a desired pattern edge of the pattern;
define a first region and a second region on the defect region, the second region extending from the desired pattern edge by a given distance, the first region being defined on a rest of the defect region;
control the gas supplying device to supply at least the etching gas inside the chamber;
control the irradiation device to irradiate the beam onto the first region;
control the gas supplying device to supply at least the etching gas inside the chamber;
control the irradiation device to irradiate the beam onto the second region; and
control the gas supplying device to supply the oxidizing gas inside the chamber so that an exposed side surface of the absorption layer is oxidized.

* * * * *